(12) United States Patent
Kim et al.

(10) Patent No.: US 8,329,507 B2
(45) Date of Patent: Dec. 11, 2012

(54) SEMICONDUCTOR PACKAGE, INTEGRATED CIRCUIT CARDS INCORPORATING THE SEMICONDUCTOR PACKAGE, AND METHOD OF MANUFACTURING THE SAME

(75) Inventors: Donghan Kim, Gyenggi-do (KR); Kiwon Choi, Gyenggi-do (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 57 days.

(21) Appl. No.: 12/768,857

(22) Filed: Apr. 28, 2010

(65) Prior Publication Data
US 2010/0210074 A1    Aug. 19, 2010

Related U.S. Application Data

(62) Division of application No. 11/959,276, filed on Dec. 18, 2007, now Pat. No. 7,728,422.

(30) Foreign Application Priority Data

Feb. 21, 2007    (KR) .............................. 2007-0017537

(51) Int. Cl.
    *H01L 21/50* (2006.01)
(52) U.S. Cl. ........ 438/106; 438/108; 438/118; 438/125; 438/127; 257/E21.499
(58) Field of Classification Search .................. 438/118, 438/108, 125, 126, 127, 106; 257/E21.499
    See application file for complete search history.

(56) References Cited

U.S. PATENT DOCUMENTS

| | | | | |
|---|---|---|---|---|
| 5,894,108 A * | 4/1999 | Mostafazadeh et al. | ...... | 174/529 |
| 6,011,315 A * | 1/2000 | Toyosawa et al. | ............. | 257/783 |
| 6,028,774 A * | 2/2000 | Shin et al. | ..................... | 361/764 |
| 6,060,782 A * | 5/2000 | Ohsono et al. | ................ | 257/738 |
| 6,249,046 B1 * | 6/2001 | Hashimoto | .................... | 257/691 |
| 6,288,905 B1 | 9/2001 | Chung | | |
| 6,365,963 B1 | 4/2002 | Shimada | | |
| 6,972,381 B2 * | 12/2005 | Hashimoto | .................... | 174/260 |
| 6,987,313 B2 * | 1/2006 | Asada | .......................... | 257/692 |
| 2005/0019982 A1 | 1/2005 | Wakabayashi et al. | | |
| 2005/0161783 A1 | 7/2005 | Hashimoto | | |
| 2005/0189623 A1 | 9/2005 | Akram et al. | | |
| 2006/0091511 A1 | 5/2006 | Kim et al. | | |
| 2006/0261456 A1 | 11/2006 | Steffen | | |
| 2006/0292752 A1 | 12/2006 | Connell et al. | | |

FOREIGN PATENT DOCUMENTS

| | | |
|---|---|---|
| CA | 2555394 A1 | 2/2007 |
| CN | 1574263 A | 2/2005 |
| JP | 07-276871 | 10/1995 |
| JP | 09-008222 | 1/1997 |
| JP | 09-508330 | 8/1997 |
| JP | 11-091272 | 4/1999 |

(Continued)

*Primary Examiner* — Michael Trinh
(74) *Attorney, Agent, or Firm* — Muir Patent Consulting, PLLC

(57) ABSTRACT

One embodiment of a semiconductor package described herein includes a substrate having a first through-hole extending therethrough; a conductive pattern overlying the substrate and extending over the first through-hole; a first semiconductor chip facing the conductive pattern such that at least a portion of the first semiconductor chip is disposed within the first through-hole; and a first external contact terminal within the first through-hole and electrically connecting the conductive pattern to the first semiconductor chip.

15 Claims, 13 Drawing Sheets

FOREIGN PATENT DOCUMENTS

| | | |
|---|---|---|
| JP | 2002-501261 | 1/2002 |
| JP | 2002-092577 | 3/2002 |
| JP | 2002-124625 | 4/2002 |
| KR | 1998-043253 | 9/1998 |
| WO | 05-206203 | 8/1993 |
| WO | WO 2007-088757 | 8/2007 |

* cited by examiner

SEMICONDUCTOR PACKAGE, INTEGRATED CIRCUIT CARDS INCORPORATING THE SEMICONDUCTOR PACKAGE, AND METHOD OF MANUFACTURING THE SAME

CROSS-REFERENCE TO RELATED PATENT APPLICATION

This application is a divisional of and claims the benefit of priority under 35 U.S.C. §120 to U.S. patent application Ser. No. 11/959,276 filed on Dec. 18, 2007, now U.S. Pat. No. 7,728,422, the disclosure of which is incorporated herein by reference in its entirety, and which claims the benefit of priority under 35 U.S.C. §119 to Korean Patent Application No. 10-2007-0017537, filed on Feb. 21, 2007 in the Korean Intellectual Property Office, the disclosure of which is incorporated herein in its entirety by reference.

BACKGROUND

1. Field of Invention

Embodiments of the present invention generally relate to semiconductor packages, electronic system such as integrated circuit (IC) cards incorporating semiconductor packages, and methods of manufacturing the same. More particularly, embodiments of the present invention relate to semiconductor packages that increase contact area between a surface of the semiconductor package and an opposing surface of a card body and methods of manufacturing the same. Other embodiments of the present invention relate to semiconductor packages having reduced thicknesses and methods of manufacturing the same.

2. Description of the Related Art

A chip-on-board (COB) type semiconductor package is typically used to manufacture IC cards, e.g., smart cards. The IC cards are commonly used nowadays in various applications, replacing magnetic cards.

Referring to FIG. 1, the COB type semiconductor package includes a semiconductor chip 3 attached to a top surface of a semiconductor package substrate 4. An active surface 3a of the semiconductor chip 3 is electrically connected to a metal layer 5 disposed on another surface of the semiconductor package substrate 4 opposite the top surface, using bonding wires 6 that extend through wire holes 4a defined in the semiconductor package substrate 4. The bonding wires 6 are generally needed as the active surface 3a is disposed over the top surface of the semiconductor package substrate 4, opposite to the surface on which the metal layer 5 is disposed. The COB type semiconductor package is coupled to a card body 2 using an adhesive (not shown) between a surface 1a of the COB type semiconductor package and an opposing surface of the card body 2. In particular, the COB type semiconductor package is disposed within a cavity 2a defined in the card body 2.

The bonding wires 6 inevitably protrude from the active surface 3a of the semiconductor chip 3 to a certain height, thereby forming a loop where the wires 6 extend away from the active surface 3a and then bend toward the metal layer 5. An encapsulant 9 is also provided so as to encapsulate the wires 6. A sufficient amount of encapsulant 9 must be, therefore, provided to protect the wires 6 from the external environment. Accordingly, the encapsulant 9 creates a relatively large molding region "B", leaving a relatively small bonding region "A" where the surface 1a of the semiconductor package and opposing surface of the card body 2 can be bonded to each other. Furthermore, because the bonding wires 6 need to be formed on both sides of the semiconductor chip 3, the length of the molding region "B" is additionally increased and the length of the bonding region A is further reduced while the total length of the available package system is limited.

It has been also discovered that edges of the substrate 4 tend to deform during manufacturing of the COB type semiconductor package. Thus, because the bonding region "A" is relatively small with the conventional system, the substrate 4 tends to separate from the card body 2 and the resulting IC card can be easily damaged or broken.

These problems can become more severe as the size of the semiconductor chip 3 increases and the package system or the IC card is subject to a harsher environment.

FIG. 2 is a cross-sectional view of another conventional package system to solve the above discussed problems.

Referring to FIG. 2, a conventional package system can be provided as a flip-chip-type COB package system. As shown in FIG. 2, an IC card includes a card body 12 having a cavity 12a defined therein. A semiconductor chip 13 attached to a semiconductor package substrate 14 to form a flip-chip-type COB semiconductor package. In the flip-chip-type COB semiconductor package, the active surface 13a of the semiconductor chip 13 is electrically connected to a metal layer 15, using conductive bumps 18 which are coupled to intermediate metal layers 17. In turn, the intermediate metal layers 17 are electrically connected to metal layers 15 by conductive vias 16 that extend through the package substrate 14. The semiconductor package is bonded to the card body 2 using an adhesive (not shown) between a surface 11a of the flip-chip-type COB semiconductor package and an opposing surface of the card body 2.

The conductive bumps 18 protrude from the surface of the semiconductor chip 13 away from a bottom surface of the cavity 12a and an encapsulant 19 is provided so as to encapsulate the conductive bumps 18. However, a sufficient amount of the encapsulant 19 must also be provided to adequately fix the semiconductor chip 13 to the intermediate metal layers 17 and the substrate 14.

Accordingly, the encapsulant 19 maintains a relatively large molding region "B", leaving a relatively small bonding region "A" where an adhesive can be applied between the surface 11a of the semiconductor package and an opposing surface of the card body 12. The substrate 14 or the semiconductor package also tends to separate from the card body 12 as in the IC card discussed in FIG. 1. Moreover, the presence of the intermediate metal layers 17 tends to increase the overall thickness "T" of the flip chip type COB semiconductor package system and increase the cost and complexity of manufacturing the flip-chip-type COB package system. Thus, even with the package system discussed with respect to FIG. 2, the above discussed problems are not sufficiently solved.

The present invention addresses these and other disadvantages of the conventional art.

SUMMARY

One embodiment of the present invention can be exemplarily characterized as a semiconductor package that includes a substrate comprising an upper surface, a lower surface opposite the upper surface and a first through-hole extending from the upper surface to the lower surface; a conductive pattern on the upper surface of the substrate and extending over the first through-hole; a first semiconductor chip facing the conductive pattern, at least a portion of the first semiconductor chip being disposed within the first through-hole; and a first external contact terminal within the first through-hole and electrically connecting the conductive pattern to the first semiconductor chip.

Another embodiment of the present invention can be exemplarily characterized as a method of forming a semiconductor package that includes providing a substrate comprising an upper surface and a lower surface opposite the upper surface; forming a first through-hole within the substrate, the first through-hole extending from the upper surface to the lower surface; forming a conductive pattern on the upper surface of the substrate, wherein the conductive pattern extends over the first through-hole; providing at least a portion of the first semiconductor chip within the first through-hole; and electrically connecting the conductive pattern to the semiconductor chip with a first external contact terminal located within the first through-hole.

Yet another embodiment of the present invention can be exemplarily characterized as a method of forming an electronic system that includes providing a substrate comprising an upper surface and a lower surface opposite the upper surface; forming a first through-hole within the substrate, the first through-hole extending from the upper surface to the lower surface; forming a conductive pattern on the upper surface of the substrate, wherein the conductive pattern extends over the first through-hole; providing at least a portion of a first semiconductor chip within the first through-hole; electrically connecting the conductive pattern to the semiconductor chip with a first external contact terminal located within the first through-hole; providing an insulating material between the conductive pattern and the first semiconductor chip; and coupling the substrate to package body to form the electronic system, wherein at least a portion of the substrate is disposed within a recess defined within the package body.

Still another embodiment of the present invention can be exemplarily characterized as an electronic system that includes a semiconductor package and a package body containing the semiconductor package. The semiconductor package may include a substrate comprising an upper surface, a lower surface opposite the upper surface and a first through-hole extending from the upper surface to the lower surface; a conductive pattern on the upper surface of the substrate and extending over the first through-hole; a first semiconductor chip facing the conductive pattern, at least a portion of the first semiconductor chip being disposed within the first through-hole; and a first external contact terminal within the first through-hole and electrically connecting the conductive pattern to the first semiconductor chip.

BRIEF DESCRIPTION OF THE DRAWINGS

Hereinafter, embodiments of the present invention will be described with reference to the accompanying drawings, in which.

DETAILED DESCRIPTION

Figure 1:
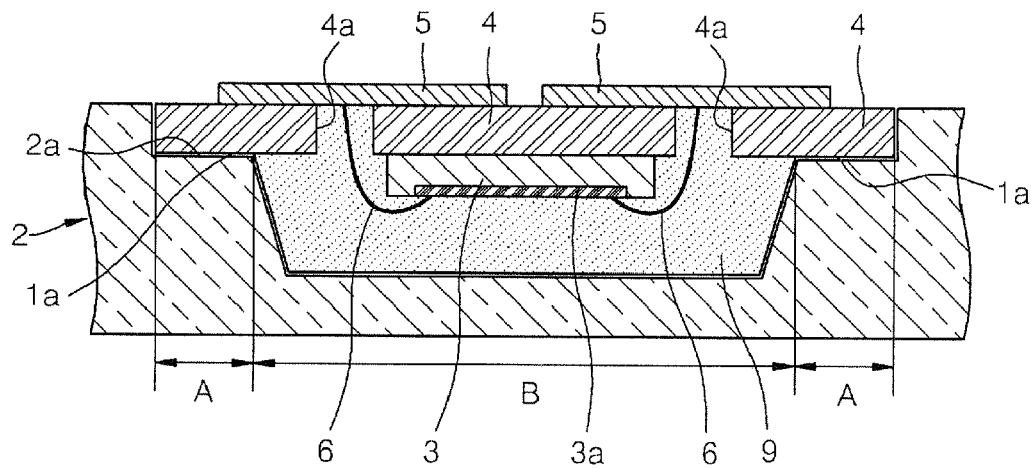
FIG. 1 is a cross-sectional view of a conventional package system coupled to with a card body to form an integrated circuit (IC) card.

Exemplary embodiments of the present invention will now be described more fully hereinafter with reference to the accompanying drawings. These embodiments may, however, be realized in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout the specification.

Figure 3A:
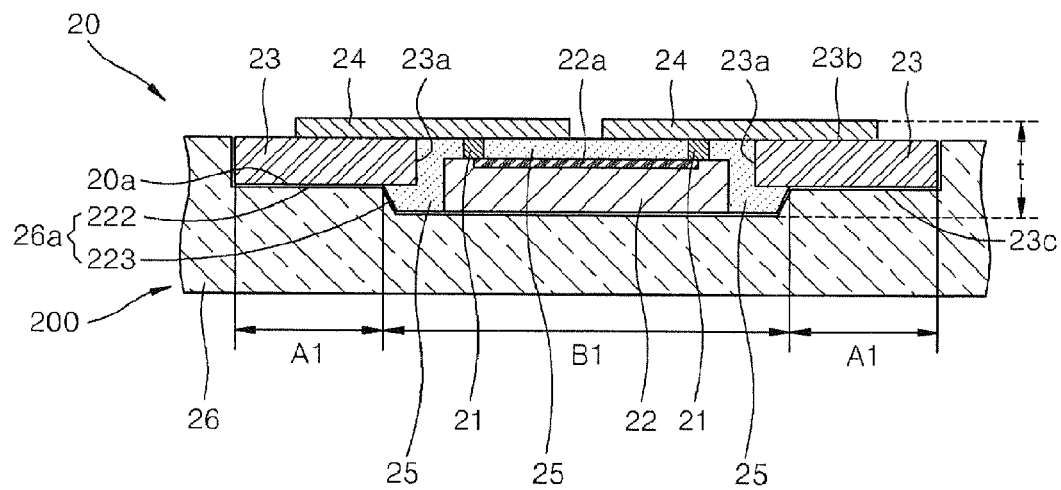
FIG. 3A is a cross-sectional view of a package system according to one embodiment.
Figure 4:
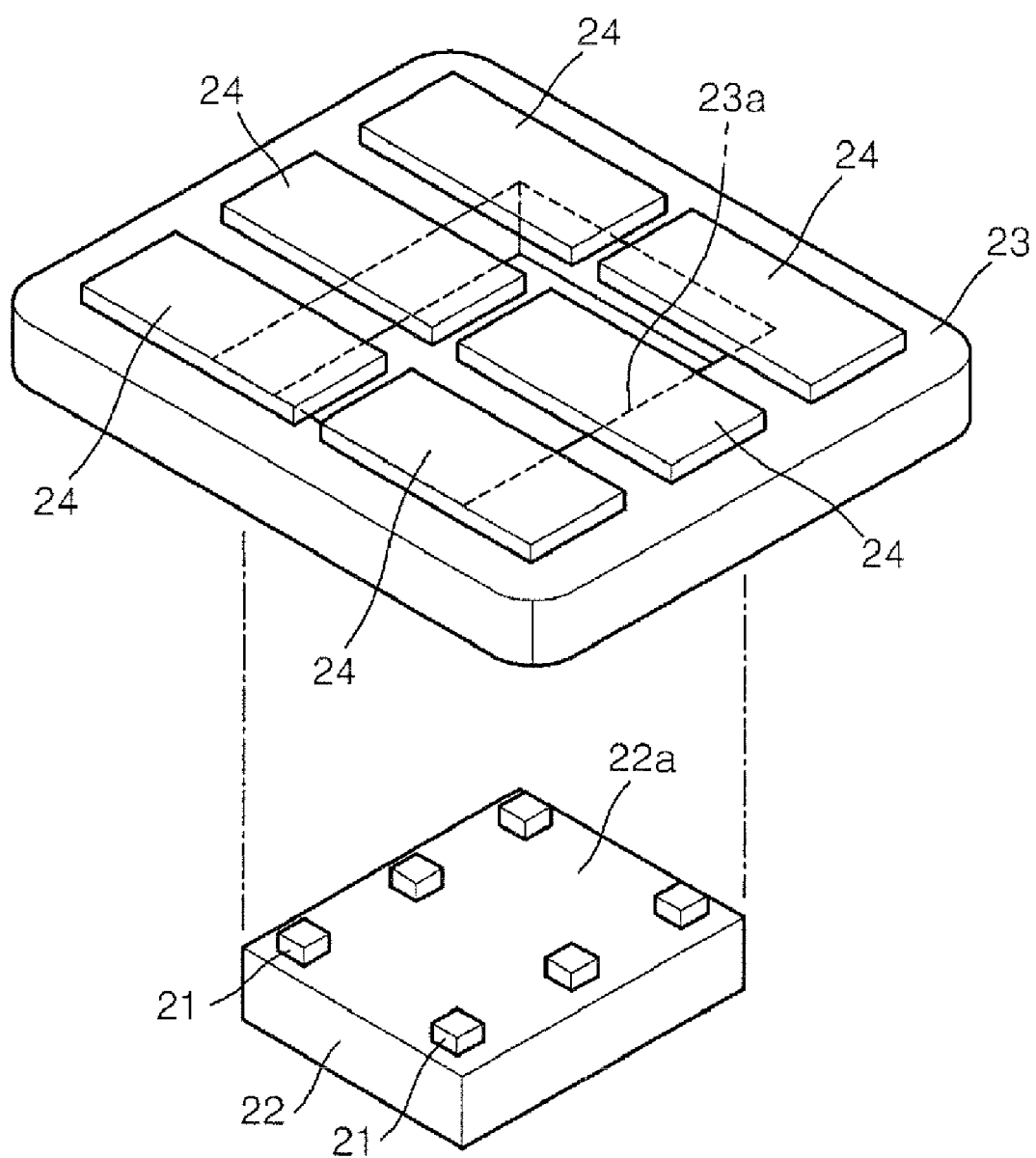
FIG. 4 is an exploded perspective view of one embodiment of a semiconductor package incorporated within the package system shown in FIG. 3A.
Figure 5:
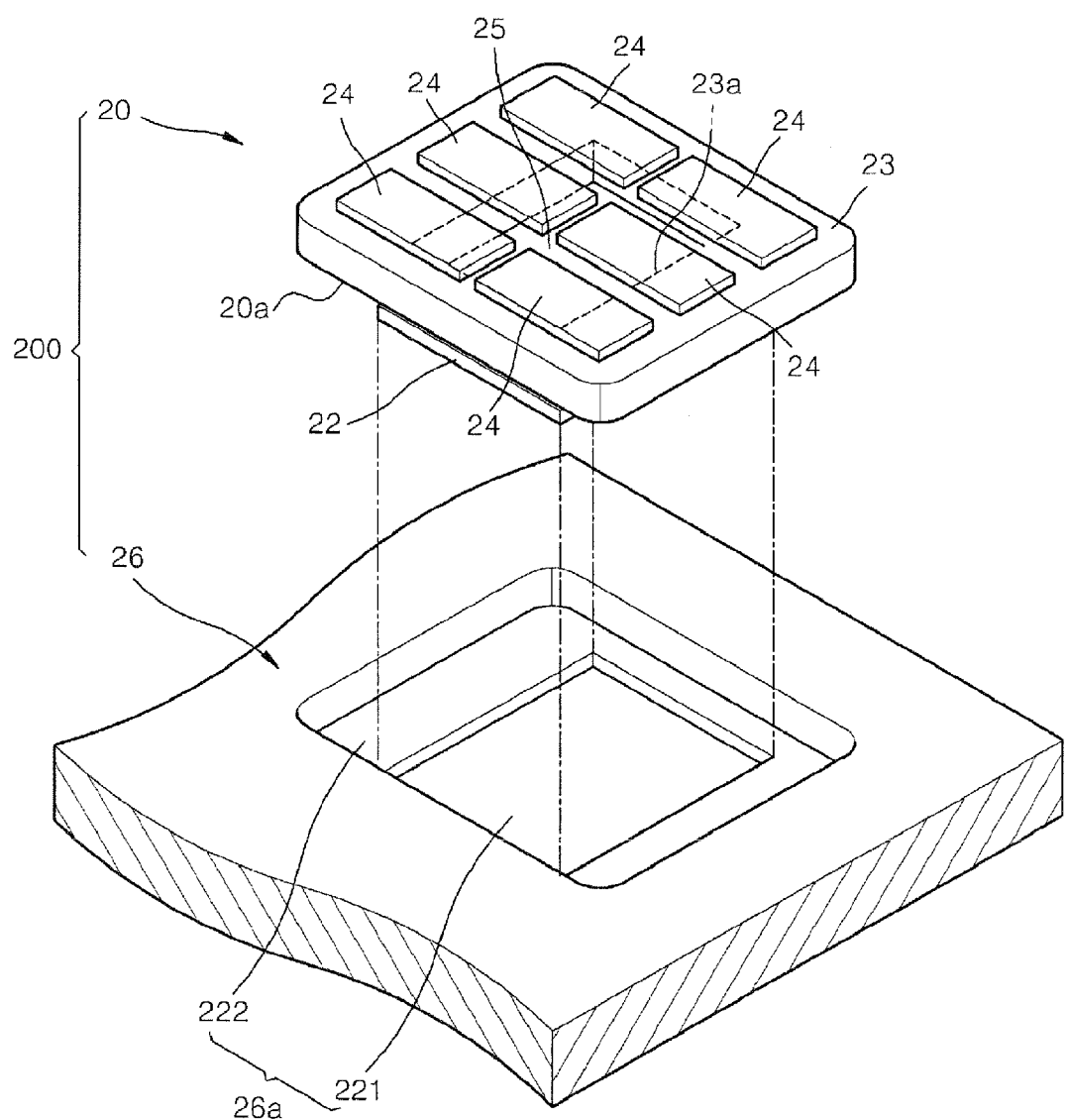
FIG. 5 is an exploded perspective view cross-sectional view of one embodiment of the package system shown in FIG. 3A.

FIG. 3A is a cross-sectional view of a package system according to one embodiment. FIG. 4 is an exploded perspective view of one embodiment of a semiconductor package incorporated within the package system shown in FIG. 3A. FIG. 5 is an exploded perspective view cross-sectional view of one embodiment of the package system shown in FIG. 3A.

Referring to FIG. 3A, an IC card or package system 200 according to one embodiment may, for example, include a semiconductor package 20 and a card body 26.

The card body 26 may include a recess 26a defined therein. The recess 26a is generally configured to receive the semiconductor package 20. In one embodiment, the recess 26a may, for example, include a chip-receiving portion 223 configured to receive the first semiconductor chip 22 and a substrate-receiving portion 222 configured to receive the substrate 23.

The semiconductor package 20 may, for example, include a first semiconductor chip 22, a plurality of first external contact terminals 21 on the first semiconductor chip 22, a package substrate 23 and a plurality of conductive patterns 24 disposed on the package substrate 23. The semiconductor package 20 has an adhesive surface 20a to be bonded to an opposing surface of the card body 26, employing known techniques such as using an adhesive. The conductive patterns 24 may be formed using a conventional technique, e.g., forming a conductive layer on the substrate 23 and performing a photolithography to form a conductive pattern.

In one embodiment, the package substrate 23 may, for example, include an upper surface 23b, a lower surface 23c and a first through-hole 23a extending from the upper surface 23b to the lower surface 23c. The plurality of conductive patterns 24 may, for example, be provided on the upper surface 23b of the substrate 23 and extend over the first through-hole 23a. Also, the first semiconductor chip 22 may face the plurality of conductive patterns 24 and at least a portion of the first semiconductor chip 22 may be disposed within the first through-hole 23a (e.g., as exemplarily shown in FIG. 4).

Figure 2:
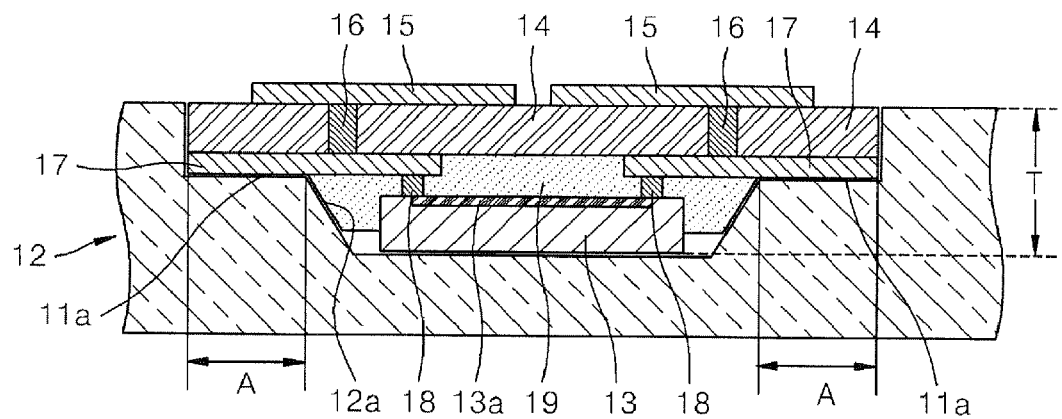
FIG. 2 is a cross-sectional view of another conventional package system.

Further, the plurality of first external contact terminals 21 may electrically connect the plurality of conductive patterns 24 to the first semiconductor chip 22. The first external contact terminals 21 may contact the plurality of conductive patterns 24 within the first through-hole 23a. Because the first external contact terminals 21 can directly contact the plurality of conductive patterns 24, the metal layer 17 shown in FIG. 2 is not necessary in the embodiment and thus can be removed as will be explained further below.

Because at least portion of the first semiconductor chip 22 is disposed within the first through-hole 23a, the overall thickness "t" of the semiconductor package can be reduced compared with conventional semiconductor packages to the extent that the first semiconductor chip 22 is inserted or included in the first through-hole 23a. For example, the package thickness "t" can be reduced because there is no extra metal layer between the semiconductor chip and the conductive patterns 24, as in conventional semiconductor packages.

In one embodiment, a method of forming the semiconductor package 20 may be characterized as a method that includes providing a substrate 23 including an upper surface and a lower surface opposite the upper surface, forming a first through-hole 23a within the substrate 23 and extending from the upper surface to the lower surface, forming a conductive pattern 24 on the upper surface of the substrate 23 so as to extend over the first through-hole 23a, providing a first semiconductor chip 22 within at least a portion of the first through-hole 23a and electrically connecting the conductive pattern 24 to the semiconductor chip 22 with a first conductive interconnect 21 located within the first through-hole 23a. As also exemplarily described above, a method of forming the semiconductor package 20 may be characterized as a method that includes forming a plurality of first conductive interconnects 21 and a plurality of conductive patterns 24 such that the plurality of first conductive interconnects 21 electrically connects the first semiconductor chip 22 to the plurality of conductive patterns 24.

As exemplarily shown in FIG. 3A, a bottom surface of the plurality of first external contact terminals 21 may be located between the upper surface 23b and the lower surface 23c of the substrate 23.

In one aspect, in the present embodiment, the first semiconductor chip 22 may include an active surface 22a that faces toward the conductive patterns 24 as shown in, for example, FIG. 3A. Alternatively, the active surface 22a may face away from the conductive patterns 24. In this case, conductive through vias may be formed through the semiconductor chip 22 to be connected to the conductive patterns 24 as illustrated in, for example, FIG. 11.

Figure 3B:
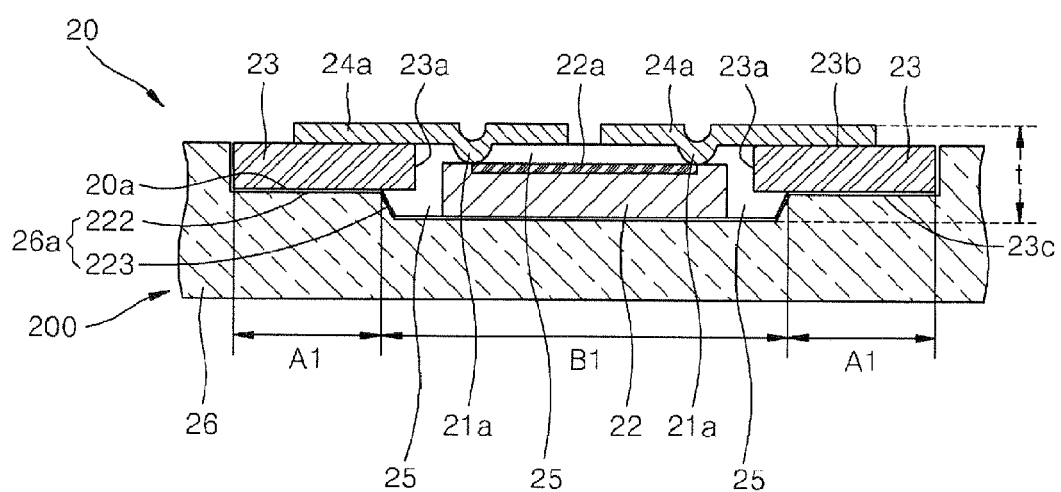
FIG. 3B is a cross-sectional view of a package system according to another embodiment.

In one embodiment, the plurality of first external contact terminals 21 may be a conductive bump such as a solder bump, a conductive ball such as a solder ball, or the like, which are disposed on the first semiconductor chip 22. For example, conductive bumps or conductive balls may be formed by forming a plurality of pads on the active surface 22a of the first semiconductor chip 22, forming a passivation layer pattern over the active surface 22a of the first semiconductor chip 22 to expose at least a portion of each of the plurality of pads, and providing a conductive material (e.g., lead, tin, or the like or a combination thereof) on the exposed portion of each of the plurality of pads. Conductive bumps may also be formed by bonding a wire to the exposed portion of each of the plurality of pads and severing the wire at a certain height above the pads. The plurality of first external contact terminals 21 may be exemplarily formed by providing a seed layer over the active surface 22a of the first semiconductor chip 22, forming a photoresist pattern over the seed layer, patterning the seed layer, removing the photoresist pattern and electroplating a conductive material upon the patterned seed layer. In one embodiment, the seed layer may include copper and have a thickness of about 0.5 µm while the conductive material may include gold. In another embodiment, although not shown, the plurality of first external contact terminals 21 and corresponding ones of the plurality of conductive patterns 24 may be provided as a unitary structure. In such an embodiment, the plurality of external contact terminals 21 protrude from corresponding ones of the plurality of conductive patterns 24 so as to contact the first semiconductor chip 22 as exemplarily shown in FIG. 3B. For example, as shown in FIG. 3B, a conductive pattern 24a may include a protrusion 21a protruding away from a bottom surface thereof to contact the first semiconductor chip 22. In one embodiment, the conductive patterns 24a may be formed by, for example, bending the conductive patterns 24 before attaching them to the substrate 23. It will be appreciated, however, that the conductive patterns 24a may be configured in any manner as desired so as to contact the first semiconductor chip 22. For example, the conductive patterns 24a may be formed by stamping.

In addition, an insulating material 25 may be provided between the first semiconductor chip 22 and the plurality of conductive patterns 24. As a result, the active surface 22a, where integrated circuits are formed, and the first external contact terminals 21 can be covered with the insulating material 25 and thus can be protected from the external environment. With the insulating material 25 that may be formed on the substrate 23, the first semiconductor chip 22 can be securely affixed to the substrate 23. The insulating material 25 may, for example, include an insulating material such as adhesive, epoxy, an epoxy molding compound (EMC), polyamide resin, or the like or a combination thereof.

In one embodiment, the insulating material 25 may be provided by injecting an insulating material into the space defined between the first semiconductor chip 22, the substrate 23 and the conductive patterns 24.

With some embodiments of the invention described above, it is possible to reduce the amount of the insulator material 25 onto the substrate 23 while the area of the adhesive surface 20a can be increased. In particular, the bonding region "A1" can be increased while the molding region "B1" can be reduced. This is particularly true as the insulating material 25 does not need to be sufficiently provided to cover intermediate metal layers as in the conventional package system shown in FIG. 2.

Consequently, the semiconductor package 20 can be securely coupled to the card body 26 and, therefore, the separation of the semiconductor package 20 from the card body 12 or the damage to the semiconductor package 20 can be significantly reduced or inhibited.

As more clearly shown in FIG. 4, each of the plurality of conductive patterns 24 may be configured substantially identically. For example, each of the conductive patterns 24 may be substantially rectangular. In one embodiment, the conductive patterns 24 may include a conductive material such as metal and may have a thickness greater than about 18 µm. In another embodiment, the first through-hole 23a may have a substantially rectangular shape, when viewed in plan view.

Further, as shown in FIG. 4, some of conductive patterns 24 extending over corner regions of the first through-hole 23a are supported by a region of the substrate 23 defining two adjoining edges of the first through-hole 23a. Some of conductive patterns 24 extending over side regions of the first through-hole 23a are supported by a region of the substrate 23 defining one edge of the first through-hole 23a. Accordingly, only one region of each conductive pattern 24 may be supported by the substrate 23. In other words, each conductive pattern 24 is supported by the substrate 23 at one region. Therefore, a first portion of the plurality of conductive patterns 24 may extend over corner regions of the first through-hole 23a and a second portion of the plurality of conductive patterns 24 may extend over side regions of the first through-hole 23a, which are located between the corner regions.

Also, as shown in FIG. 4, the semiconductor chip 22 can be disposed within or inserted in the first through-hole 23a. The semiconductor chip 22 is coupled to the conductive patterns 24 and an insulator (not shown) can fill a space between the semiconductor chip and the substrate 23 including the conductive patterns 24. The insulator can be an encapsulant such as an adhesive, epoxy, resin including poly-amide and so on.

In view of the above, in summary, a method of forming a package system 200 (also referred to herein as an electronic system or an IC card) may be exemplarily characterized as a method that includes providing a substrate 23 comprising an upper surface and a lower surface opposite the upper surface, forming a first through-hole 23a within the substrate 23 such that the first through-hole 23a extends from the upper surface to the lower surface, forming a conductive pattern 24 on the upper surface of the substrate 23 such that the conductive pattern 24 extends over the first through-hole 23a, providing at least a portion of a first semiconductor chip 22 within the first through-hole 23a, electrically connecting the conductive pattern 24 to the semiconductor chip 24 with a first conductive interconnect 21 located within the first through-hole 23a, providing an insulating material 25 between the conductive pattern 24 and the first semiconductor chip 22 and coupling the substrate 23 to package body 26 to form an electronic system 200, wherein at least a portion of the substrate 23 is disposed within a recess 26a defined within the package body 26.

Also in view of the above, a package system 200 (also referred to herein as an electronic system or an IC card) may be exemplarily characterized as including a semiconductor package 20 and a package body 26 containing the semiconductor package 20. The semiconductor package 20 may be exemplarily characterized as including a substrate 23 having an upper surface, a lower surface opposite the upper surface and a first through-hole 23a extending from the upper surface to the lower surface, a conductive pattern 24 on the upper surface of the substrate and extending over the first through-hole 23a, a first semiconductor chip 22 facing the conductive pattern 24 such that at least a portion of the first semiconductor chip 22 is disposed within the first through-hole 23a and a first external contact terminal 21 within the first through-hole 23a and electrically connecting the conductive pattern 24 to the first semiconductor chip 22.

Also, in summary, as exemplarily described above with respect to FIGS. 3-5, the insulating material 25 creates a relatively small molding region "B1" relative to bonding region "A1" because less amount of insulating material 25 is required to adequately fix the first semiconductor chip 22 to the substrate 23 than to, for example, the intermediate metal layer 17 mentioned above with respect to FIG. 2. Accordingly, a relatively large bonding region (adhesion surface) "A1" can be provided where an adhesive can be applied between the surface 20a of the semiconductor package 20 and an opposing surface of the card body 26. As a result, the semiconductor package 20 may be prevented from separating from the card body 26. Moreover, a thickness "t" of the system package 200 can be reduced as compared to the thickness of the flip chip COB type package system shown in FIG. 2 due to the absence of the intermediate metal layers 17 and a portion of the substrate 14 disposed between the conductive vias 16. Further, the package system 200 shown in FIGS. 3 and 5 can be manufactured at a relatively reduced cost and complexity.

Figure 6:
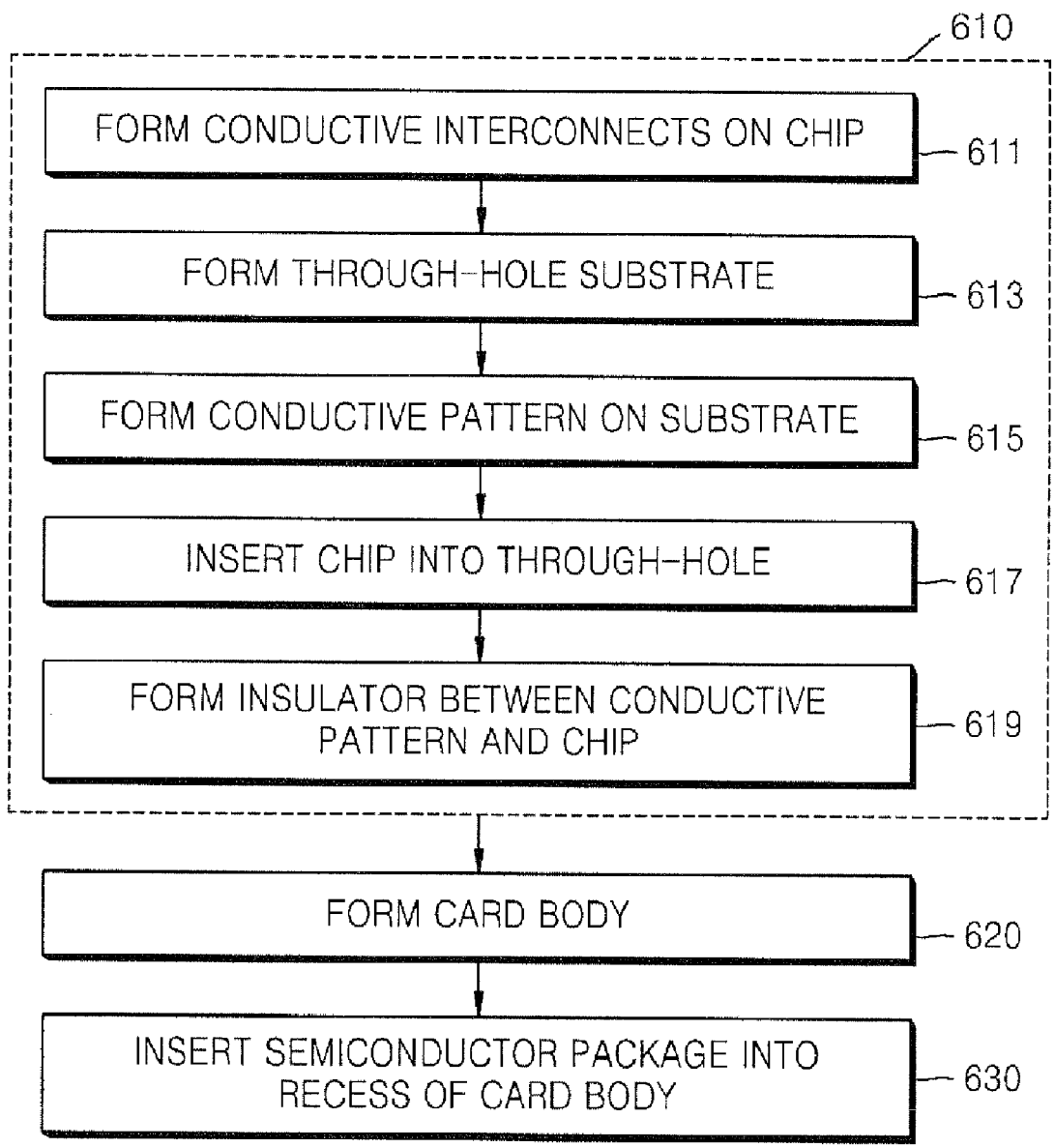
FIG. 6 is flow chart describing an exemplary method of manufacturing the package system shown in FIG. 3A.

FIG. 6 is flow chart describing an exemplary method of manufacturing the package system shown in FIGS. 3-5.

Referring to FIG. 6, an exemplary method of manufacturing the package system 200 shown in FIGS. 3-5 can be generally characterized as including a first process 610 of forming a semiconductor package 20, a second process 620 of forming a card body 26 and a third process 630 of inserting the semiconductor package 20 into the recess 26a of the card body 26.

In one embodiment, the first method 610 of forming a semiconductor package 20 may be performed as follows. At 611, the plurality of first external contact terminals 21 are formed on the first semiconductor chip 22. At 613, a first through-hole 23a is formed in the substrate 23. At 615, conductive patterns 24 are formed on the substrate 23. In one embodiment, a portion of the conductive patterns 24 are exposed through the first through-hole 23. At 617, the first semiconductor chip 22 is inserted into the first through-hole 23a. At this time, an active surface of the semiconductor chip 22 faces the conductive patterns 24 and is electrically connected thereto through the plurality of first external contact terminals 21. At 619, an insulating material 25 is formed or injected between the conductive patterns 24 and the first semiconductor chip 22 to encapsulate the first semiconductor chip 22 and the conductive patterns 24. In one embodiment, the insulating material 25 may be formed during insertion of the semiconductor package 20 into the recess 26a of the card body 26. That is, the insulating material 25 may be provided simultaneously as the semiconductor package 20 is coupled to the card body 26.

At 620, separately from the above-described processes, a recess 26a is formed in the card body 26. In one embodiment, the recess 26a may be formed upon forming the card body 26 (e.g., during a molding process). At 630, the semiconductor package 20 formed by the above processes is inserted into the recess 26a to form a package system 200.

In some embodiments, the process 619 and the process 630 can be simultaneously performed while performing an underfill process.

Figure 7:
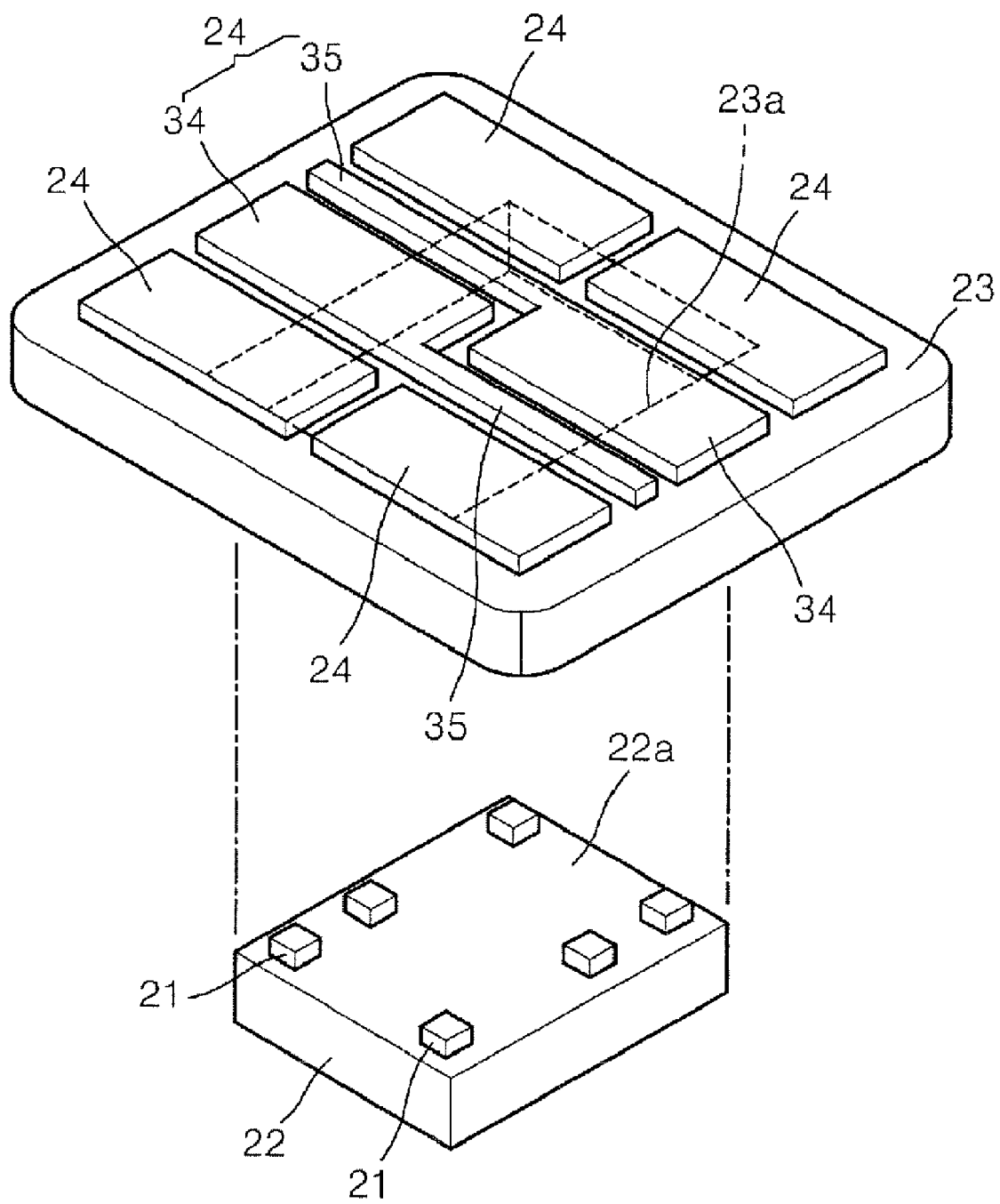
FIG. 7 is an exploded perspective view of another embodiment of a semiconductor package incorporated within the package system shown in FIG. 3.

FIG. 7 is an exploded perspective view of another embodiment of a semiconductor package incorporated within the system shown in FIG. 3A.

Referring to FIG. 7, the semiconductor package 20 may be provided similarly as discussed above with respect to FIGS. 3 and 4. According to the embodiment shown in FIG. 7, however, the plurality of conductive patterns 24 may be configured differently depending on their location on the upper surface of the substrate 23. For example, at least one of the plurality of conductive patterns 24 extending over side regions of the first through-hole 23a may include a contact portion 34 and an extension portion 35. The contact portion 34 is supported by a region (e.g., a first region) of the substrate 23 that defines an edge (e.g., a first edge) of the first through-hole 23a. The extension portion 35 is supported by another region (e.g., a second region) of the substrate 23 that defines another edge (e.g., a second edge opposite the first edge) of the first through-hole 23a. The contact portion 34 is configured to facilitate contact with an external contact terminal 21 and the extension portion 35 is configured to support a distal end of the contact portion 34. Accordingly, only two regions of each conductive pattern 24 extending over a side region of the first through-hole 23a may be supported by the substrate 23. In other words, each conductive pattern 24 extending over a side region of the first through-hole 23a is supported by the substrate 23 at a first region and at a second region. The first and second regions are spaced apart from each other. For example, for each conductive pattern 24 a region of the contact portion 34 is supported by the substrate 23 at a first side of the first through-hole 23a and a region of the extension portion 35 is supported by the substrate 23 at a second side of the first through-hole 23a, opposite the first side.

In one embodiment, the contact portion 34 of one of the conductive patterns 24 is adjacent to the extension portion 35 of another of the conductive patterns 24 along the first side (or second side) of the first through-hole 23a.

In another embodiment, the contact portion 34 supported by the substrate 23 at the first side of the first through-hole 23a may be the same shape as the contact portion 34 supported by the substrate 23 at the second side of the first through-hole 23a. Similarly, the extension portion 35 supported by the substrate 23 at the second side of the first through-hole 23a may be the same shape as the extension portion 35 supported by the substrate 23 at the first side of the first through-hole 23a.

In yet another embodiment, contact portions 34 of conductive patterns 24 extending over side regions of the first through-hole 23a may be characterized as having a rectangular shape. Similarly, extension portions 35 of conductive patterns 24 extending over side regions of the first through-hole 23a may be characterized as having a narrow strip shape.

When provided as described above with respect to FIG. 7, the conductive patterns 24 that extend over side regions of the first through-hole 23a may experience less deformation (e.g., bending, tearing, cutting, etc.) than the conductive patterns 24 as described above with respect to FIG. 4 because both ends of the conductive patterns 24 can be supported.

Figure 8:
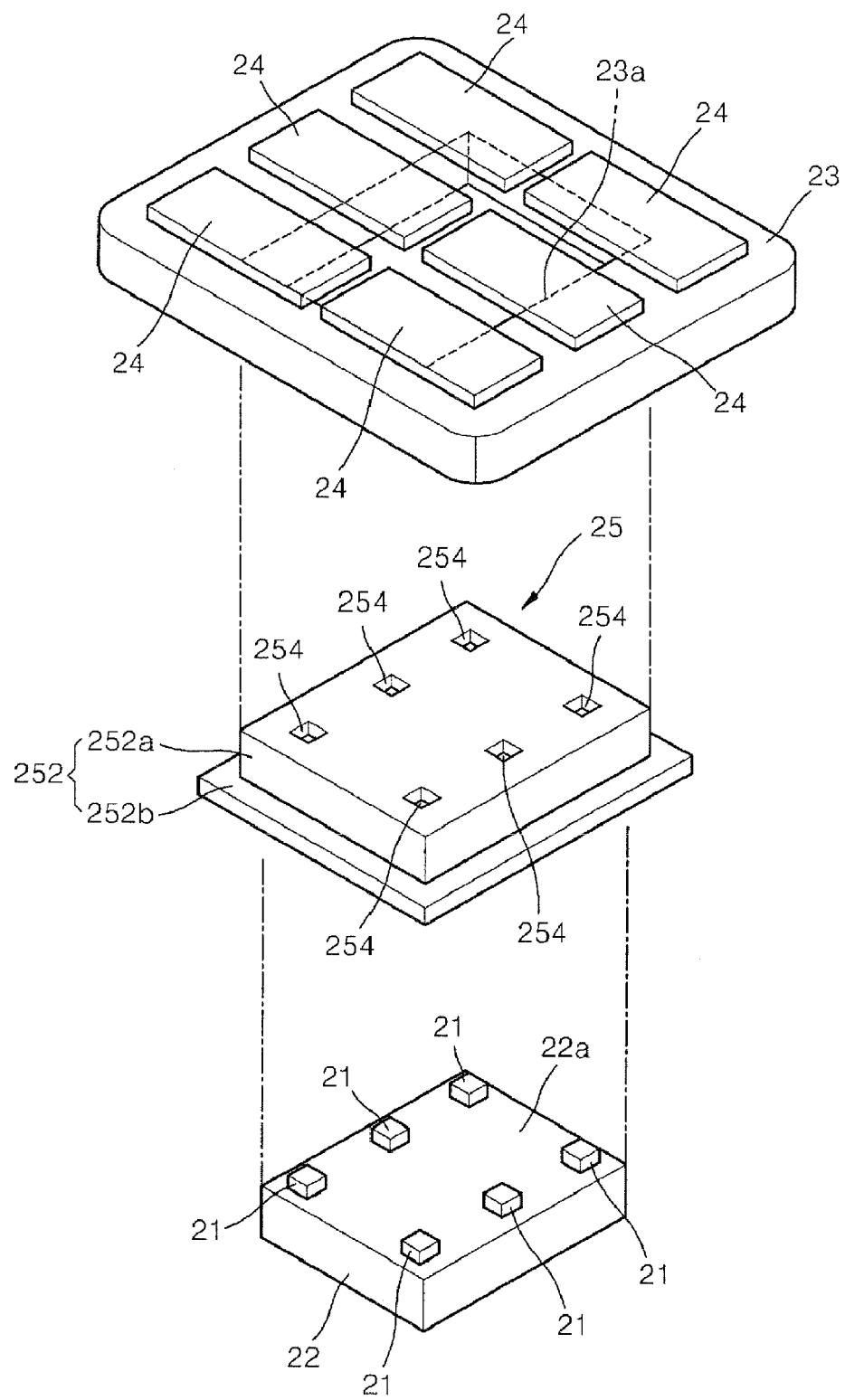
FIG. 8 is an exploded perspective view of yet another embodiment of a semiconductor package incorporated within the package system shown in FIG. 3A.

FIG. 8 is an exploded perspective view of yet another embodiment of a semiconductor package incorporated within the package system shown in FIG. 3A.

Referring to FIG. 8, the semiconductor package 20 may be provided similarly as discussed above with respect to FIGS. 3 and 4. According to the embodiment shown in FIG. 8, however, the insulating material 25 may be provided as an insulator frame body 252 formed before the first semiconductor chip 22 is inserted into the first through-hole 23a. In one embodiment, the insulator frame body 252 may include an upper portion 252a and a lower portion 252b. The upper portion 252a of the insulator frame body 252 may be configured to be inserted into the first through-hole 23a. The lower portion 252b of the insulator frame body 252 may be configured to be coupled to the lower surface of the substrate 23 (e.g., via adhesive material). In one embodiment, both the upper portion 252a and the lower portion 252b may be respectively attached to the semiconductor chip 22 and the substrate 23 using an adhesive material, to thereby securely couple the semiconductor chip 22 to the substrate 23.

A plurality of insulator frame body through-holes 254 may be defined within the insulator frame body 252 and extend from an upper surface of the insulator frame body 252 to a lower surface of the insulator frame body 252. In one embodiment, the plurality of first external contact terminals 21 may be inserted into the plurality of insulator frame body through-holes 254. In another embodiment, the plurality of first external contact terminals 21 may extend fully through the plurality of insulator frame body through-holes 254 to be coupled to the conductive patterns 24.

Thus, as exemplarily described above, the insulating material 25 according to one embodiment may be characterized as an insulator frame body 252 including an insulator frame body through-hole 254 defined therethrough such that a first external contact terminal 21 may extend through the insulator frame body through-hole 254.

In one embodiment, a method of providing the insulating material 25 may, for example, include forming an insulator frame body 252, wherein the insulator frame body 252 comprises an insulator frame body through-hole 254 defined therethrough, and disposing the insulator frame body 252 within the first through-hole 23a to be adjacent to the conductive pattern 24 a method of electrically connecting a conductive pattern 24 to the first semiconductor chip 22 may, for example, include inserting a first external contact terminal 21 through the insulator frame body through-hole 254.

When the plurality of first external contact terminals 21 extend fully through the plurality of insulator frame body through-holes 254, the first semiconductor chip 22 may, in one embodiment, contact the lower portion 252b of the insulator frame body 252. In such an embodiment, the first semiconductor chip 22 may be coupled to the lower portion 252b of the insulator frame body 252 by, for example, an adhesive.

Constructed as described above, the insulator frame body 252 may help align the plurality of first external contact terminals 21 with respect to corresponding ones of the plurality of conductive patterns 24 within the first through-hole 23a.

Figure 9A:
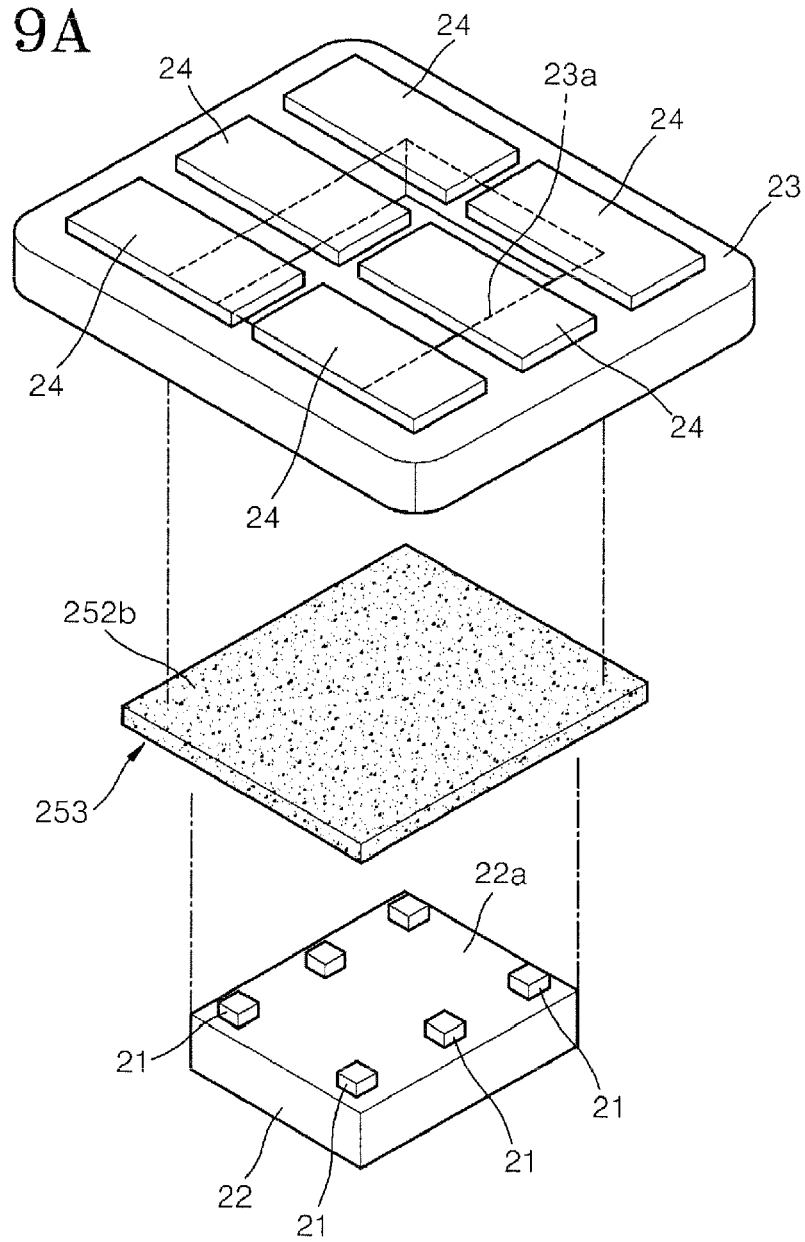
FIG. 9A is an exploded perspective view of still another embodiment of a semiconductor package incorporated within the package system shown in FIG. 3A.
Figure 9B:
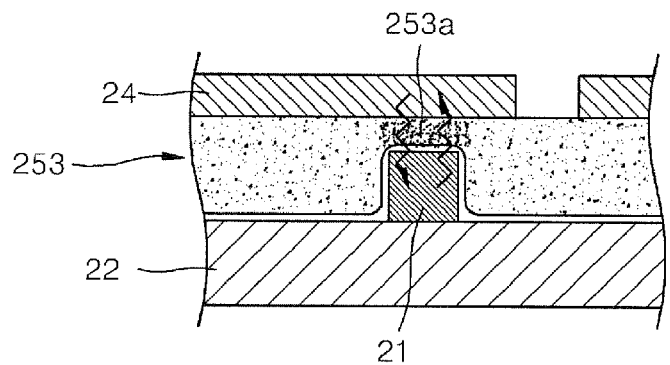
FIG. 9B is a cross-sectional view of a portion of the semiconductor package shown in FIG. 9A.

The insulator frame body 252 may be formed of an insulating material such as polyimide, epoxy, resin etc. FIG. 9A is an exploded perspective view of still another embodiment of a semiconductor package incorporated within the package system shown in FIG. 3A. FIG. 9B is a cross-sectional view of a portion of the semiconductor package shown in FIG. 9A.

Referring to FIG. 9A, the semiconductor package 20 may be provided similarly as discussed above with respect to FIGS. 3 and 4. According to the embodiment shown in FIG. 9A, however, an anisotropic conductive film (ACF) 253 may be provided as the insulating material 25 of FIGS. 3 and 4 is provided and formed before the first semiconductor chip 22 is inserted into the first through-hole 23a. The ACF 253 may include a plurality of conductive particles 253a disposed (e.g., suspended) therein. In such an embodiment, the ACF 253 may be provided as a compressible material. When not compressed, the ACF 253 exhibits electrically insulative characteristics. However, when compressed a sufficient amount, the conductive particles 253a are brought into contact so that electrical signals can be transmitted therethrough.

Referring to FIG. 9B, when the first semiconductor chip 22 is inserted into the first through-hole 23a, the plurality of first external contact terminals 21 locally compress regions of the anisotropic conductive film 253 so that electrical signals can be transmitted between the plurality of first external contact terminals 21 and the conductive patterns 24 through the plurality of conductive particles 253a. In one embodiment, the height of the plurality of first external contact terminals 21 may be about 8-16 μm and the thickness of the anisotropic conductive film 253 may be about 5-20 μm greater than the height of the plurality of first external contact terminals 21.

FIGS. 10A-10E are cross-sectional views of some embodiments of semiconductor packages.

As described above, the insulating material 25 may be provided by injecting an insulating material into a space defined between the first semiconductor chip 22, the substrate 23 and the conductive patterns 24. During the injection process, it is possible that the insulating material 25 may flow into the space defined between adjacent conductive patterns 24 or even onto an upper surface of the conductive patterns 24. Accordingly, a barrier member such as 40, 41, 42 or 43 as described in FIGS. 10A-10E may be provided to prevent the insulating material 25 from flowing between and onto the conductive patterns 24 as will be explained in greater detail below.

In one embodiment, the barrier member may be disposed before forming the insulating material 25.

Figure 10A:
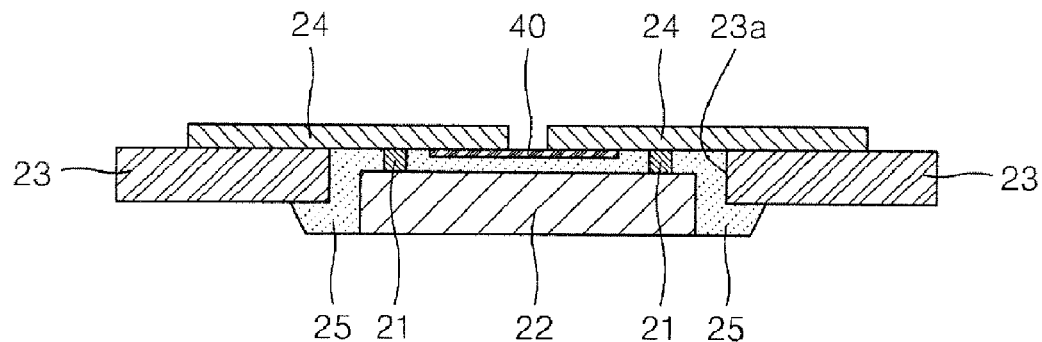
FIGS. 10A-10E are cross-sectional views of some embodiments of semiconductor packages.

In some embodiments, a barrier member may be provided to extend between pairs of adjacent ones of the plurality of conductive patterns 24 across at least a portion of the space defined between the adjacent ones of the plurality of conductive patterns 24 as shown in, for example, FIG. 10A. Also, in FIG. 10A, a barrier member 40 such as an insulating film may be provided on lower surfaces of the adjacent conductive patterns 24 to span the space defined between the adjacent conductive patterns 24.

Figure 10B:
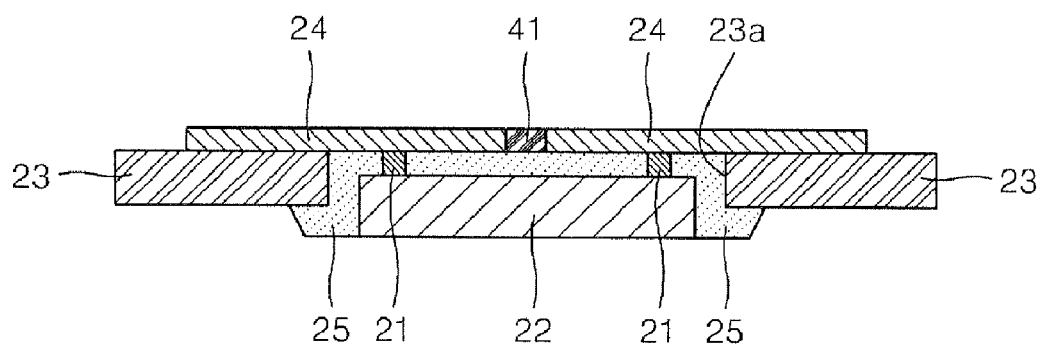

In some embodiments, a barrier member may be disposed within at least a portion of the space defined between the adjacent ones of the plurality of conductive patterns 24 as shown in, for example, FIG. 10B. For example, in FIG. 10B, a barrier member 41 may be provided in the space defined between the adjacent conductive patterns 24. As exemplarily shown in FIG. 10B, the barrier member 41 may be disposed substantially entirely between upper and lower surfaces of the conductive patterns 24.

In some embodiments, a barrier member may be located between the adjacent ones of the plurality of conductive patterns 24 and the first semiconductor chip 22 as shown in, for example, FIGS. 10C and 10D as will be explained in detail.

Figure 10C:
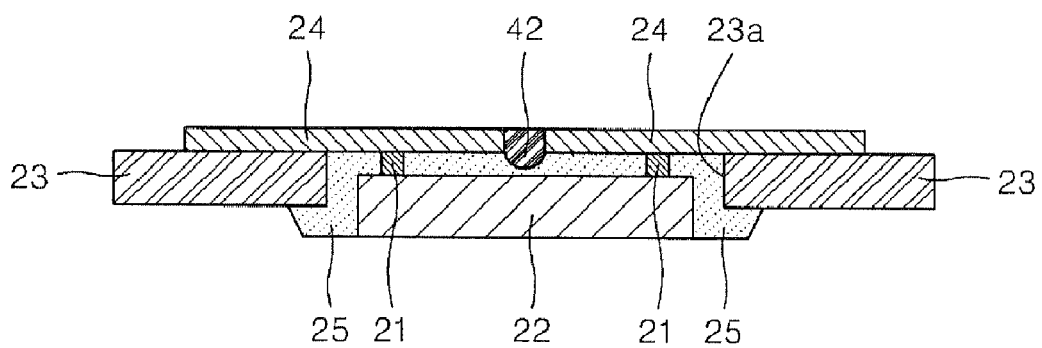

Referring to FIG. 10C, a barrier member 42 may be provided in the space defined between the adjacent conductive patterns 24 and may partially extend into a space defined between the conductive patterns 24 and the first semiconductor chip 22. That is, the barrier member 42 may partially extend into the first through-hole 23a. With the barrier member 42 shown in FIG. 10C, the leakage currents can be reduced.

Figure 10D:
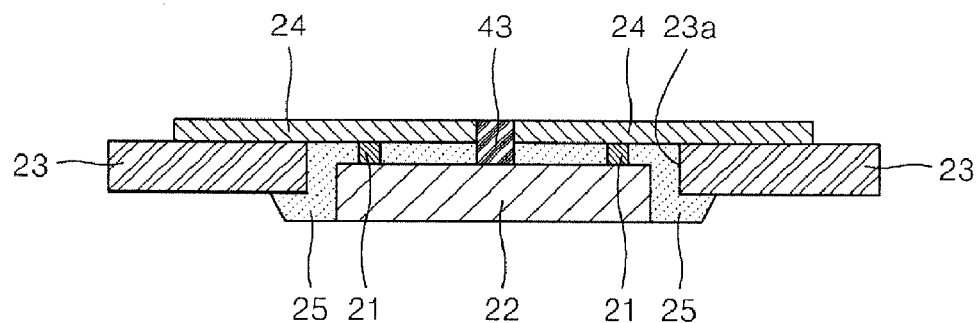

Also, referring to FIG. 10D, a barrier member 43 may be provided in the space defined between the adjacent conductive patterns 24 and contact the first semiconductor chip 22. With the barrier member 43, which fully extends to the first semiconductor chip 22, the leakage currents can be further reduced.

In one aspect, the barrier members shown in FIGS. 10A-D may be formed using a screen printing method before the insulating material 25 is provided between the first semiconductor chip 22, the substrate 23 and the conductive patterns 24.

Figure 10E:
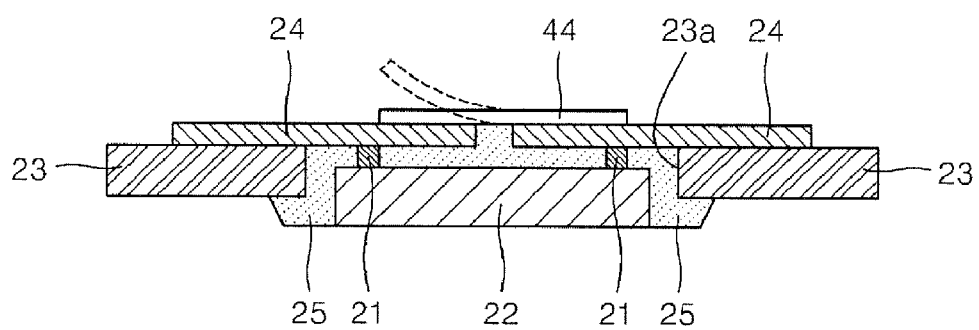

Referring to FIG. 10E, a barrier member 44 may be provided on the upper surfaces of the adjacent conductive patterns 24 to span the space defined between the conductive patterns 24.

In some embodiments, the barrier members 40 to 43 may include a resin-type material. In another embodiment, the barrier member 44 may be a tape-type material. Thus, a method of forming a semiconductor package according to one embodiment may, for example, include removing barrier member 44 after forming the insulating material 25.

In one embodiment, the tape-type material may include a material that is selectively attachable/detachable from the conductive patterns 24. In one embodiment, the resin-type material may include a material that can be stiffened (e.g., after the insulating material has been injected).

Figure 11:
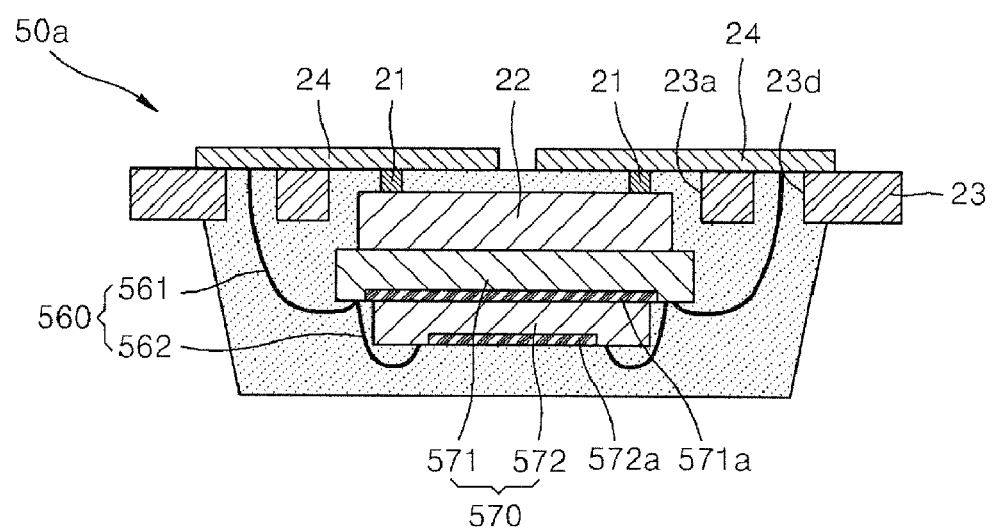
FIG. 11 is a cross-sectional view of one embodiment of a heterogeneous multi-chip semiconductor package.
Figure 12:
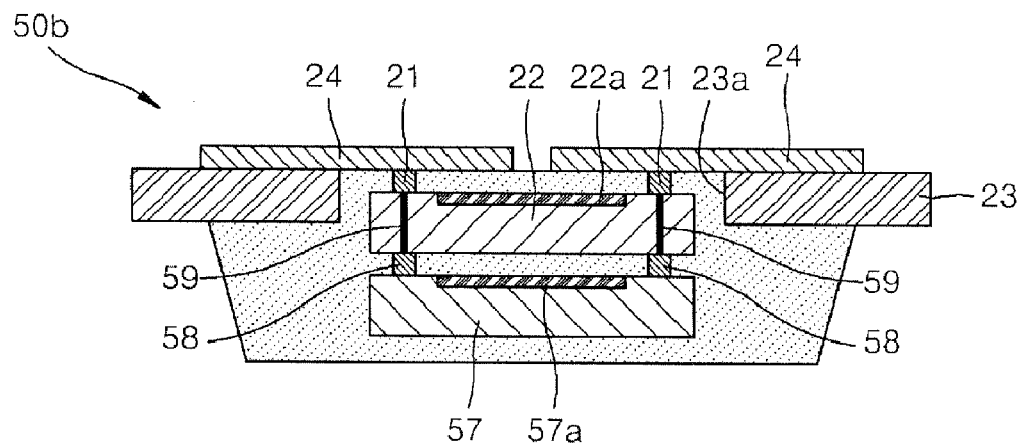
FIG. 12 is a cross-sectional view of one embodiment of a homogeneous multi-chip semiconductor package.

FIG. 11 is a cross-sectional view of one embodiment of a heterogeneous multi-chip semiconductor package. FIG. 12 is a cross-sectional view of one embodiment of a homogeneous multi-chip semiconductor package. It will be appreciated that the embodiments discussed above with respect to FIGS. 3-10E are not limited to single chip semiconductor packages and can readily be applied or extended to various types of multi-chip packages. For example, and with reference to FIG. 11, the multi-chip semiconductor package 50a may include a first semiconductor chip 22 connected to conductive patterns 24 via the plurality of first external contact terminals 21 and a plurality of second chips 571 and 572 (collectively identified at 570) connected to conductive patterns 24 via bonding wires 561 and 562 (collectively identified at 560). The second chip 571 may be coupled to first semiconductor chip 22 by any suitable means (e.g., via an adhesive material). The second chip 572 may be coupled to another second chip 571 by any suitable means. In the illustrated embodiment, the plurality of first external contact terminals 21 extend through the first through-hole 23a to electrically connect the first semiconductor chip 22 with the conductive patterns 24 and the wires 561 extend through through-holes 23d to electrically connect the second chips 570 with the conductive patterns 24. In one embodiment, the second chips 570 may be different from the first semiconductor chip 22. Accordingly, the multi-chip semiconductor package 50a may be a heterogeneous multi-chip semiconductor package.

Referring to FIG. 12, a multi-chip semiconductor package 50b may include a first semiconductor chip 22 connected to conductive patterns 24 via the plurality of first external contact terminals 21 and a second chip 57 connected to conductive patterns 24 by a conductive through via 59 extending through the first semiconductor chip 22. In the illustrated embodiment, external contact terminals 58 electrically connect the second semiconductor chip 57 with the conductive through via 59. In view of the above, a method of forming the semiconductor package 50b may be characterized as a method that includes coupling a second semiconductor chip 57 to the first semiconductor chip 22 and forming a conductive through via 59 through the first semiconductor chip 22, wherein the conductive through via 59 electrically connects the first and second semiconductor chips 22 and 57.

In one embodiment, the first chip 22 and second chip 57 may be identical, may be substantially the same or may be similar (e.g., based on functionality). Accordingly, the multi-chip semiconductor package 50b may be a homogeneous multi-chip semiconductor package.

FIGS. 13A-13E are cross-sectional views of other embodiments of multi-chip semiconductor packages.

Figure 13A:
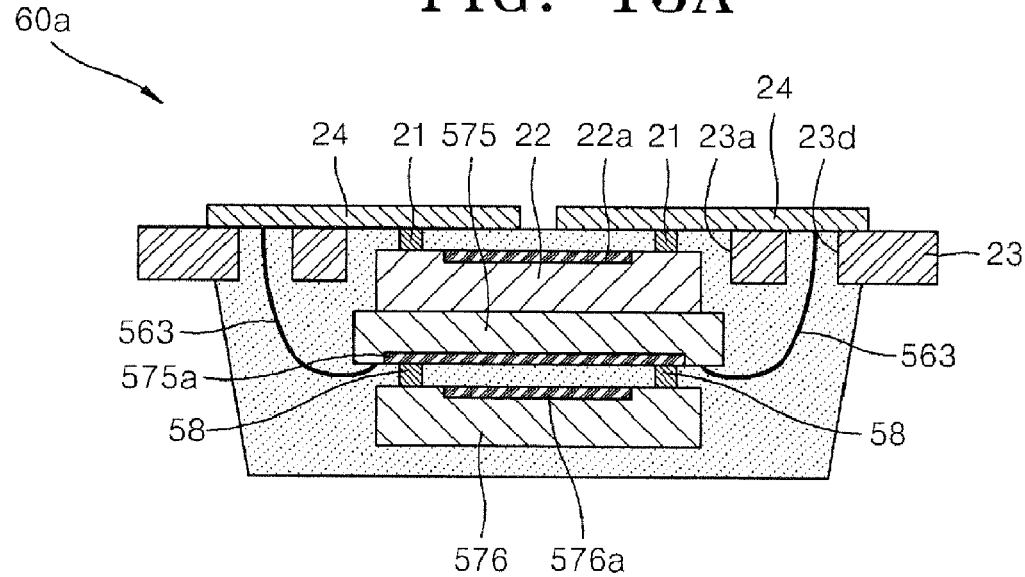
FIGS. 13A-13E are cross-sectional views of other embodiments of multi-chip semiconductor packages.

Referring to FIG. 13A, a multi-chip semiconductor package 60a may, for example, include a first semiconductor chip 22 electrically connected to conductive patterns 24 via the plurality of first external contact terminals 21, a second semiconductor chip 575 electrically connected to conductive patterns 24 via wires 563 and a third semiconductor chip 576 coupled to the second semiconductor chip 575 and electrically connected to the active surface 575a of second semiconductor chip 575 via external contact terminals 58.

Figure 13B:
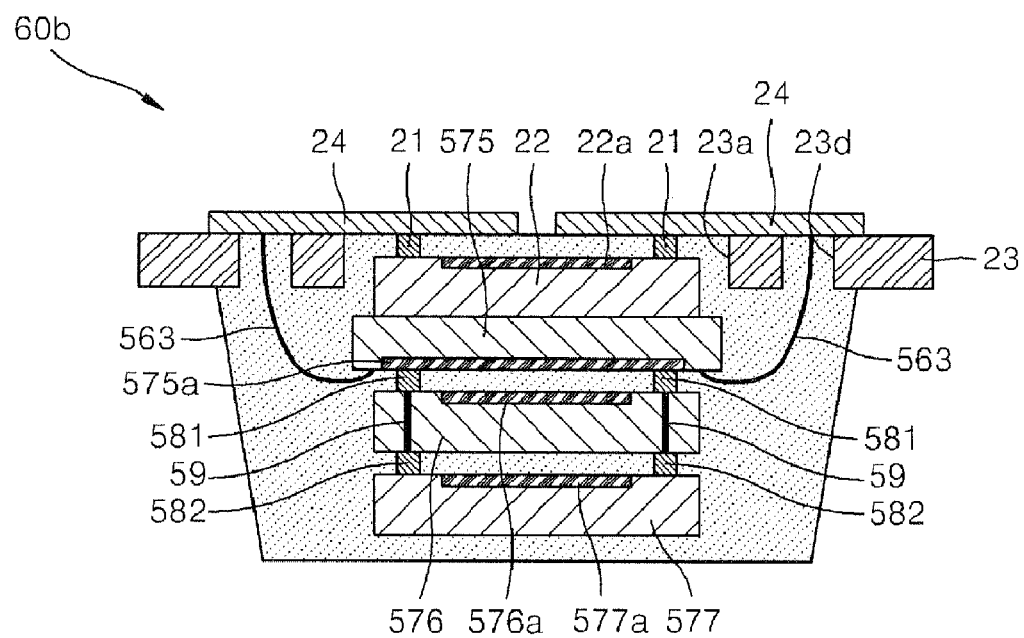

Referring to FIG. 13B, a multi-chip semiconductor package 60b may, for example, be provided similarly as discussed with respect to FIG. 13A but may further include an additional semiconductor chip 577 electrically connected to an active surface 575a of a second semiconductor chip 575 by a conductive through via 59 extending through a third semiconductor chip 576. In the illustrated embodiment, external contact terminals 582 electrically connect the additional semiconductor chip 577 with the conductive through via 59.

Figure 13C:
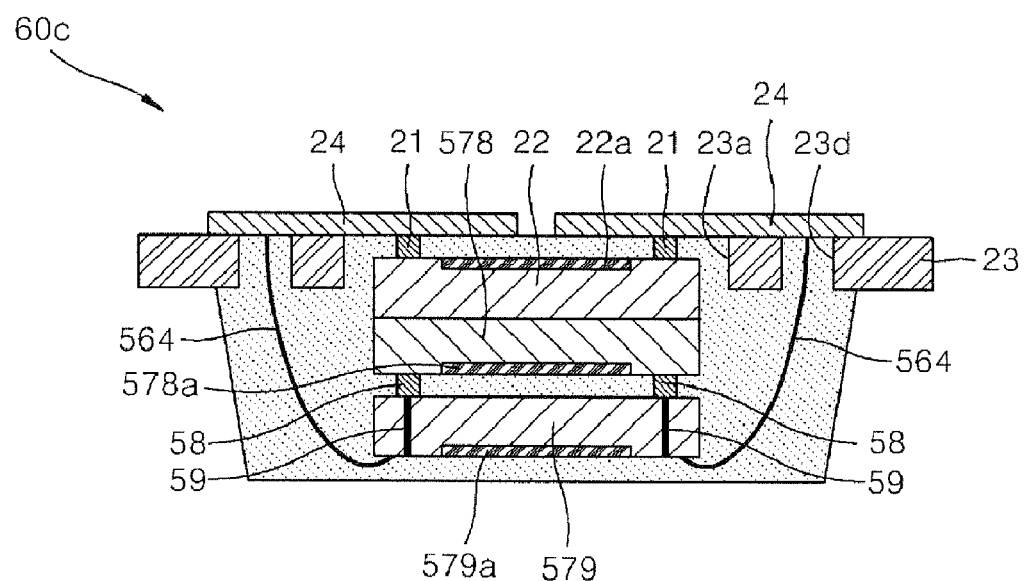

Referring to FIG. 13C, a multi-chip semiconductor package 60c may, for example, include a first semiconductor chip 22 electrically connected to conductive patterns 24 via the plurality of first external contact terminals 21, a second semiconductor chip 578 coupled to the first semiconductor chip 22 and a third semiconductor chip 579 electrically connected to conductive patterns 24 via wires 564. The second semiconductor chip 578 may be electrically connected to the conductive patterns 24 by a conductive through via 59 extending through the third semiconductor chip 579. In the illustrated embodiment, external contact terminals 58 electrically connect the second semiconductor chip 578 with the conductive through via 59.

Figure 13D:
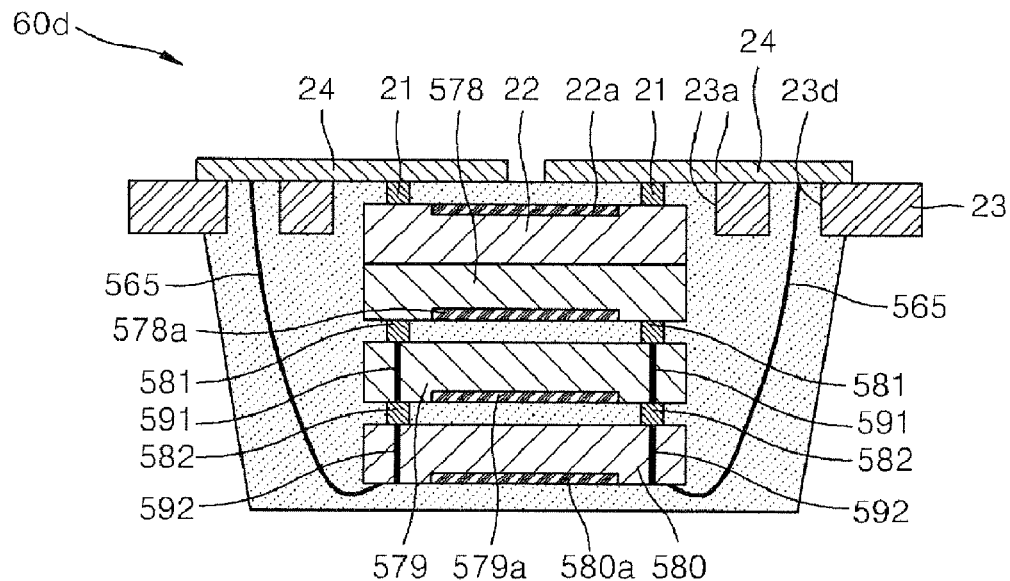

Referring to FIG. 13D, a multi-chip semiconductor package 60d may, for example, be provided similarly as discussed with respect to FIG. 13C, but may further include an additional semiconductor chip 580 electrically connected to conductive patterns 24 via wires 565. In the illustrated embodiment, a third semiconductor chip 579 may be electrically connected to the conductive patterns 24 by a conductive through via 592 extending through the additional semiconductor chip 580, in which external contact terminals 582 electrically connect the third semiconductor chip 579 with the conductive through via 592. Also in the illustrated embodiment, a second semiconductor chip 578 may be electrically connected to the conductive patterns 24 by a conductive through via 591 extending through the third semiconductor chip 579, in which external contact terminals 581 electrically connect the second semiconductor chip 578 with the conductive through via 591.

Figure 13E:
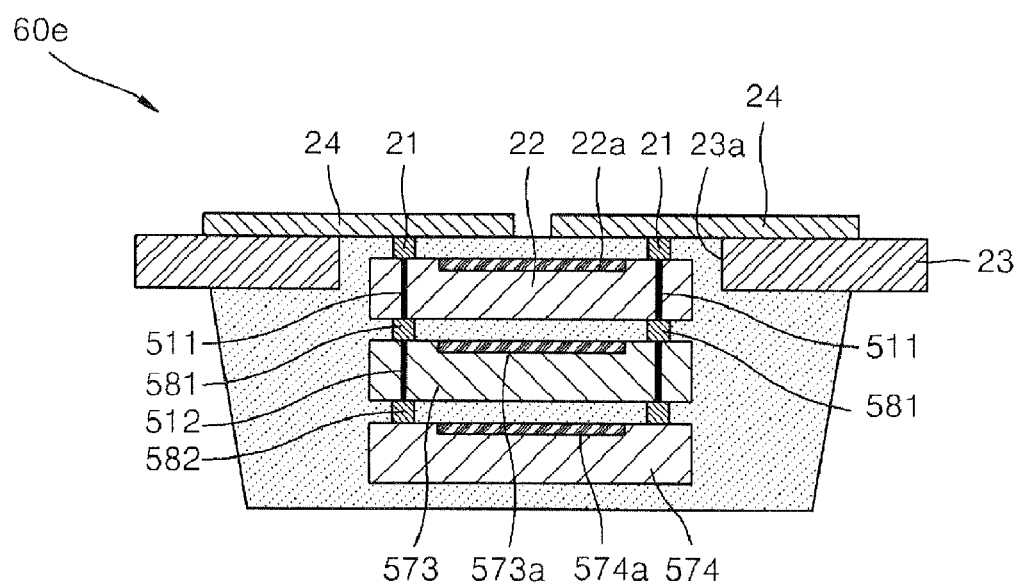

Referring to FIG. 13E, a multi-chip semiconductor package 60e may, for example, include a first semiconductor chip 22 electrically connected to conductive patterns 24 via the plurality of first external contact terminals 21, a second semiconductor chip 573 electrically connected to the conductive patterns 24 via a conductive through via 511 extending through first semiconductor chip 22 and a third semiconductor chip 574 electrically connected to the conductive patterns 24 by a conductive through via 512 extending through second semiconductor chip 573. In the illustrated embodiment, external contact terminals 581 electrically connect the second semiconductor chip 573 with the conductive through via 511 and external contact terminals 582 electrically connect the third semiconductor chip 574 with the conductive through via 512.

According to the embodiments exemplarily described above with respect to FIGS. 3A-13E, a package system can be provided in which a semiconductor package is substantially prevented from separating from a card body because the bonding region "A1" between the card body and the semiconductor package can be significantly increased to ensure secure connection between the card body and the semiconductor package as illustrated in FIG. 3A. In other words, the adhesion between the card body and the package can be increased and, therefore, the card body and the package can be secured affixed to each other. Consequently, the durability and the reliability of the package system or IC cards can be substantially increased.

Moreover, the package system exemplarily described in the embodiments above can be made to be relatively thin, inexpensively, and without complication due, at least in part, to the configuration of the semiconductor package. This is particularly true as the semiconductor chip can be disposed within an opening of the substrate, thereby reducing the total thickness of the electronic system as the thickness of the semiconductor chip does not add to the total thickness of the electronic system. As a result, a thinner semiconductor package and an electronic system such as an IC card can be obtained according to embodiments of the present invention.

Also, according to the embodiments exemplarily described above, processing steps can be reduced compared to the prior art as the inventive methods require less metal or conductive layers, thereby substantially reducing the overall manufacturing costs.

It will be appreciated that the package system and semiconductor package, provided according to the embodiments exemplarily described above, can be implemented in conjunction with devices such as IC cards, memory cards, USB cards, internal memory packages of media players (e.g., MP3 players), mobile phones, digital cameras, and the like.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Various operations will be described as multiple discrete steps performed in a manner that is most helpful in understanding the invention. However, the order in which the steps are described does not imply that the operations are order-dependent or that the order that steps are performed must be the order in which the steps are presented.

Further, well-known structures and devices are not shown in order not to obscure the description of the invention with unnecessary detail.

While embodiments of the present invention have been particularly shown and described above, it will be understood by those of ordinary skill in the art that various changes in form and details may be made therein without departing from the spirit and scope of the present invention as defined by the following claims.

What is claimed is:

1. A method of forming a semiconductor package, the method comprising:
providing a substrate comprising an upper surface and a lower surface opposite the upper surface;
forming a first through-hole within the substrate, the first through-hole extending from the upper surface to the lower surface;
forming a first conductive pattern on the upper surface of the substrate, wherein the first conductive pattern extends over the first through-hole;
providing at least a portion of a first semiconductor chip within the first through-hole;
inserting an insulating material having a pre-formed shape in the first through-hole between the first semiconductor chip and the conductive pattern;
connecting the first conductive pattern to the first semiconductor chip through the insulating material; and
electrically connecting the first conductive pattern to the first semiconductor chip with a first external contact terminal located within the first through-hole,
wherein inserting the insulating material comprises:
providing an insulator frame body, wherein the insulator frame body comprises at least a first insulator frame body through-hole defined therethrough; and
disposing the insulator frame body within the first through-hole to be adjacent to the first conductive pattern, wherein electrically connecting the first conductive pattern to the first semiconductor chip comprises inserting the first external contact terminal through the first insulator frame body through hole.

2. The method of claim 1, wherein electrically connecting the first conductive pattern to the first semiconductor chip comprises contacting the first conductive pattern to the first external contact terminal.

3. The method of claim 1, further comprising:
forming a plurality of conductive patterns; and
forming a plurality of external contact terminals, wherein each of the plurality of external contact terminals electrically connects the first semiconductor chip to a corresponding one of the plurality of conductive patterns.

4. The method of claim 1, further comprising forming a second conductive pattern on the upper surface of the substrate, and electrically connecting the second conductive pattern to the first semiconductor chip by inserting a second external contact terminal through a second insulating frame body through hole.

5. The method of claim 1, wherein the insulator frame body comprises a rigid structure.

6. The method of claim 1, wherein the insulator frame body comprises a single insulating material.

7. The method of claim 1, wherein the insulator frame body is formed of one of polyimide, epoxy, or resin.

8. The method of claim 3, wherein forming the first through-hole includes forming a first sidewall and a second side wall opposite to the first sidewall,
wherein the first conductive pattern extends over the first sidewall of the first through-hole, and
wherein forming the plurality of conductive patterns includes forming a second conductive pattern on the upper surface of the substrate, wherein the second conductive pattern extends over the first and second sidewalls.

9. A method of forming an electronic system, the method comprising:
providing a substrate having a first through-hole extending therethrough;
forming a first conductive pattern overlying the substrate, wherein the conductive pattern extends over the first through-hole;
providing at least a portion of a semiconductor chip within the first through-hole;
electrically connecting the first conductive pattern to the semiconductor chip with a first external contact terminal located within the first through-hole;
providing an insulating material between the first conductive pattern and the semiconductor chip; and
coupling the substrate to a package body to form the electronic system, wherein at least a portion of the substrate is disposed within a recess defined within the package body,
wherein providing the insulating material comprises:
providing an insulator frame body, wherein the insulator frame body comprises at least a first insulator frame body through-hole defined therethrough; and
disposing the insulator frame body within the first through-hole to be adjacent to the first conductive pattern,
wherein electrically connecting the first conductive pattern to the semiconductor chip comprises inserting the first external contact terminal through the first insulator frame body through hole.

10. The method of claim 9, further comprising providing the insulating material and coupling the substrate to the package body simultaneously.

11. The method of claim 9, further comprising forming a second conductive pattern overlying the substrate,
wherein the first through-hole includes a first sidewall and a second sidewall opposite to the first sidewall,
wherein the first conductive pattern extends over the first sidewall of the first through-hole, and
wherein the second conductive pattern extends over the first and second sidewalls.

12. The method of claim 9, further comprising forming a second conductive pattern overlying the substrate, and electrically connecting the second conductive pattern to the semiconductor chip by inserting a second external contact terminal through a second insulating frame body through hole.

13. The method of claim 9, wherein the insulator frame body comprises a rigid structure.

14. The method of claim 9, wherein the insulator frame body comprises a single insulating material.

15. The method of claim 9, wherein the insulator frame body is formed of one of polyimide, epoxy, or resin.

* * * * *